United States Patent [19]

Kawanabe et al.

[11] Patent Number: 4,881,041
[45] Date of Patent: Nov. 14, 1989

[54] PULSE WIDTH DISTORTION CORRECTION CIRCUIT

[75] Inventors: Yoshihiro Kawanabe; Kazunaga Ida, both of Tokyo, Japan

[73] Assignee: Pioneer Electronic Corporation, Tokyo, Japan

[21] Appl. No.: 192,984

[22] Filed: May 12, 1988

[30] Foreign Application Priority Data

May 21, 1987 [JP] Japan ................. 62-124420

[51] Int. Cl.⁴ .......... H03K 5/22; H03K 5/04; H03K 3/017
[52] U.S. Cl. ................. 328/112; 328/111; 328/58; 328/155; 307/234; 307/265; 307/529
[58] Field of Search ......... 307/265, 268, 601, 234, 307/529; 328/112, 57–58, 111, 117, 55, 155

[56] References Cited

U.S. PATENT DOCUMENTS

| 3,246,247 | 4/1966 | Grindle | 328/112 |
| 3,441,877 | 4/1969 | Thompson | 307/265 |
| 3,452,220 | 6/1966 | Fritschi | 307/265 |
| 4,527,075 | 7/1985 | Zbinden | 307/265 |

FOREIGN PATENT DOCUMENTS

| 2741843 | 5/1978 | Fed. Rep. of Germany . |
| 3514155 | 10/1986 | Fed. Rep. of Germany . |
| 0159120 | 10/1982 | Japan | 307/265 |
| 0159020 | 9/1983 | Japan | 307/265 |
| 603012 | 10/1975 | Switzerland . |

OTHER PUBLICATIONS

IBM Technical Disclosure Bulletin, *Adjustable Pulse Delay/Width Circuit*, vol. 13/No. 11, Apr. 1971, p. 3566.
Patent Abstracts of Japan, Pulse Correction Circuit, 57-159120, E150, Dec. 23, 1982, vol. 6/No. 264.
Pulse Generator mit Steuerbarem Tastuerhaltnis, by Claus Kohnel, Radio Fernsehn Electronik, 1983, pp. 51, 55.

*Primary Examiner*—Stanley D. Miller
*Assistant Examiner*—Nancy Thai
*Attorney, Agent, or Firm*—Sughrue, Mion, Zinn, Macpeak & Seas

[57] ABSTRACT

A pulse width distortion correction circuit in which a digital input signal has its leading and trailing edges smoothed, is added to an analog pulse width control signal and compared to a reference voltage to provide a digital output signal with a corrected duty ratio. A duty ratio detection circuit detects the duty ratio of the digital output signal and provides the corresponding pulse width control signal so as to cause the duty ratio to assume a value of 50%.

8 Claims, 3 Drawing Sheets (a) DETECTION OF DUTY RATIO WAVE FORM OF INPUT TERMINAL (8)
(b) OUTPUT OF INVERTER (10)
(c) OUTPUT OF INVERTER (11)

PULSE WIDTH DISTORTION CORRECTION CIRCUIT

BACKGROUND OF THE INVENTION

1. Field of the Invention

The present invention relates to a pulse width distortion correction circuit in a digital transmission system.

2. Description of the Background

Conventionally, as the circuit of the kind described above, there has been known the circuit shown in FIG. 6. In FIG. 6, the circuit has a signal input terminal 1 and a delay circuit 19 for delaying an input signal applied to the signal input terminal 1 so as output a signal delayed by a time $T_d$. An AND gate 20 ANDs the output signal of the delay circuit 19 and the undelayed input signal applied to the signal input terminal 1 and supplies the result to a signal output terminal 4.

Next, the operation of the circuit of FIG. 6 will be described. Assume now that in FIG. 7, a signal (a) transmitted from a transmitter is received as a signal (b) which is prolonged by the time $T_d$ at its high level (or shortened by the time $T_d$ at its low level) due to distortion in pulse width through a transmission line. An example of such a transmission line is a light transmission line including electro-photo conversion and photoelectric conversion.

The signal (b) applied to the signal input terminal 1 is delayed by the delay circuit 2 by the time $T_d$ to be a delayed signal (c). The undelayed signal (b) and the delayed signal (c) are ANDed by the AND gate 3 so that a signal (d) is obtained at the signal output terminal 4.

Being arranged in a manner as described above, the conventional pulse width distortion correction circuit has a problem in that the correction can be achieved only in a case of specific pulse width distortion. If the pulse width distortion is changed by the condition of the transmission line or the like, not only can the correction not be achieved but conversely the pulse width distortion increases.

SUMMARY OF THE INVENTION

It is therefore an object of the present invention to solve the foregoing problem in the prior art.

It is another object of the present invention to provide a pulse width distortion correction circuit in which pulse width distortion can be corrected even if the pulse width distortion is changed by the condition of a transmission line or the like.

The foregoing objects of the present invention can be attained by a pulse width distortion correction circuit which includes a pulse width control circuit to which a digital signal is applied. A duty ratio detection circuit detects the duty ratio of an output signal of the pulse width control circuit. Then, the pulse width control circuit is controlled on the basis of a detection output of the duty ratio detection circuit.

BRIEF DESCRIPTION OF THE DRAWINGS

Other features and advantages of the present invention will be apparent from the following description taken in connection with the accompanying drawings, wherein.

DETAILED DESCRIPTION OF THE PREFERRED EMBODIMENTS

Figure 1:
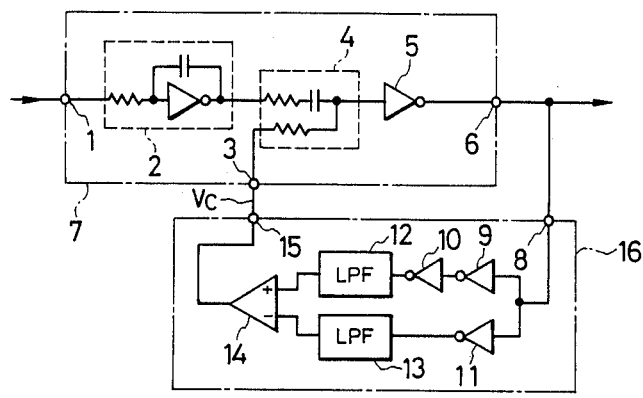
FIG. 1 is a diagram illustrating an embodiment of the pulse width distortion correction circuit according to the present invention.

An embodiment of the present invention will be described with reference to the drawings. In FIG. 1, the pulse width distortion correction circuit is provided with a signal input terminal 1 supplying an input signal to a saturating integrator 2 for smoothing (making more inclined) the leading and trailing edges of the input signal applied to the signal input terminal 1. A pulse width control terminal 3 receives a pulse width control signal. An adder 4 adds a signal on the pulse width control terminal 3 to an output signal of the integrator 2. An output signal of the adder 4 is applied to an inverter 5, whose two-state output is connected to a signal output terminal 6. A pulse width control circuit 7 is constituted by the above-mentioned circuit components 1 to 6.

An output signal of the pulse width control circuit 7 is applied to a duty ratio detection input terminal. A signal of the duty ratio detection input terminal 8 is applied to each of inverters 9 and 11. An output signal of the first inverter 9 is applied to a serially connected inverter 10. Output signals of the inverters 10 and 11 are applied respectively to low pass filters 12 and 13. An operational amplifier 14 acts as a differential amplifier to which output signals of the low pass filters 12 and 13 are applied respectively at its non-inverting and inverting inputs. A duty ratio detection output terminal 15 receives an output signal of the operational amplifier 14 and the pulse width control terminal 3 of the abovementioned pulse width control circuit 7 is connected to the duty ratio detection output terminal 15. A duty ratio detection circuit 16 is constituted by the above-mentioned circuit components 8 to 15.

Next, the operation of the present invention will be described.

Figure 2:
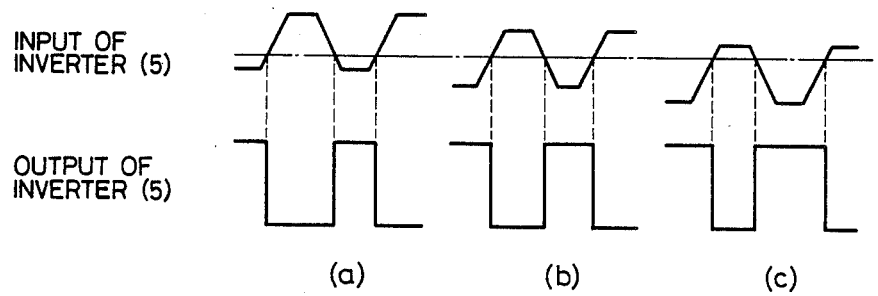
FIG. 2 is a diagram for explaining the operation of a pulse width control circuit.

The signal applied to the signal input terminal 1 is smoothed at its leading and trailing edges by the integrator 2 and then added by the adder 4 to the pulse width control signal applied to the pulse width control terminal 3. The output signal of the adder 4 is applied to the inverter 5. The output of the inverter 5, that is, the signal obtained at the signal output terminal 6, as shown in FIG. 2, has a changeable duty ratio, that is, the time ratio between its high level width and its low level width, corresponding to the voltage $V_C$ of the pulse width control signal applied to the pulse width control terminal 3. In this figure, $V_T$ is the threshold input voltage separating the two output states of the inverter 5. Case (a) is for a high value of the pulse width control signal $V_C$; case (b) is for a medium value of $V_C$; and case (c) is for a high value of $V_C$.

Figure 3:
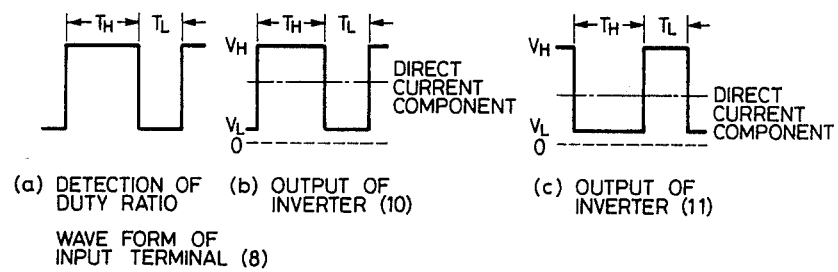
FIG. 3 is a diagram for explaining the operation of a duty ratio detection circuit.

The signal output from the inverter 5 and applied to the duty ratio detection input terminal 8 passes through the two inverters 9 and 10 and also passes in parallel through the single inverter 11 so that signals in phase with and in opposite phase to the signal at the duty ratio detection input terminal 8 are applied to the low pass filters 12 and 13 respectively. In the low pass filters 12 and 13, the respective DC components (slowly varying components) of the input signals are derived and applied to the operational amplifier 14. Assume now that the high level time width and the low level time width of the signal of the duty ratio detection input terminal 8 are $T_H$ and $T_L$ respectively, and that the high level and the low level of each of the respective output signals of the inverters 10 and 11 are respectively $V_H$ and $V_L$. FIG. 3 illustrates in trace (a) the output of the pulse width control circuit 7 which is applied to the duty ratio detection input terminal 8. Trace (b) represents the in-phase output of inverter 10 and trace (c) represents the out-of-phase output of inverter 11.

Then, the DC component applied to the non-inverting input of the operational amplifier 14 is expressed by $$V_L + (V_H - V_L) \cdot T_H/(T_H + T_L)$$

and the DC component applied to the inversion input is expressed by $$V_H - (V_H - V_L) \cdot T_H/(T_H + T_L).$$

The output of the operational amplifier 14 is then expressed by, $$\{2 \cdot T_H/(T_H + T_L) - 1\} \cdot (V_H - V_L) \cdot A$$

where A represents the gain of the operational amplifier 14. That is, if the high level time width $T_H$ of the fixed repetition period $(T_H + T_L)$ of the signal of the duty ratio detection input terminal 8 is increased, the output voltage of the duty ratio detection output terminal 15 is increased. On the contrary, if the high level time width $T_H$ is decreased, the output voltage is decreased. In the case where the duty ratio detection output terminal 15 is connected to the pulse width control terminal 3 and the duty ratio detection input terminal 8 is connected to the signal output terminal 6, this system operates so as to make the voltage values at the non-inverting and inverting inputs of the operational amplifier 14 equal to each other under the condition that the gain of the operational amplifier 14 is selected to be sufficiently large. That is, setting the inverting and non-inverting inputs to be equal produces the equations $$V_L + (V_H - V_L) \cdot T_H/(T_H + T_L) = V_L - (V_H - V_L) \cdot T_H/(T_H + T_L)$$

so that the following equation is established $$T_H/(T_H + T_L) = 0.5.$$

Consequently, the signal having the following relationship is obtained:

$$T_H : T_L = 1 : 1.$$

Although the case where the integrator 2 is provided to give inclination to the leading and trailing edges of the signal has been illustrated in the above-mentioned embodiment, the integrator 2 may be omitted when the transfer speed of the signal is high, since a smoothing effect can be obtained by the resistance of the adder 4, the input capacitance of the inverter 5, and so on.

Moreover, although the case where the inverters 9 and 11 are provided between the duty ratio detection input terminal 8 and the low pass filter 12 has been illustrated in the above-mentioned embodiment, these inverters 9 and 10 may be omitted under the additional condition that the high level voltage and the low level voltage of each of the inverters 5 and 11 are equal to each other.

Figure 4:
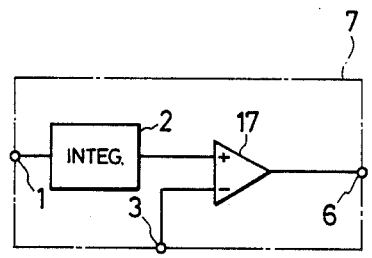
FIG. 4 is a diagram illustrating another embodiment of the pulse width control circuit according to the present invention.
Figure 5:
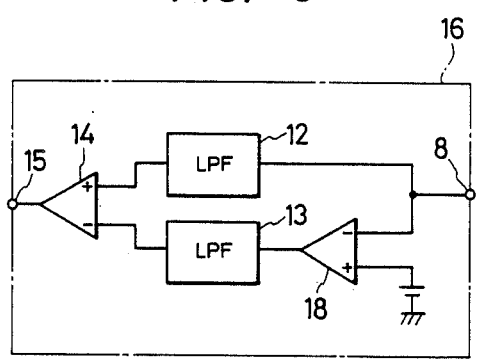
FIG. 5 is a diagram illustrating an embodiment of the duty ratio detection circuit according to the present invention.
Figure 6:
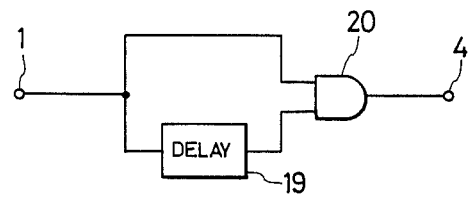
FIG. 6 is a diagram illustrating a conventional pulse width distortion correction circuit.
Figure 7:
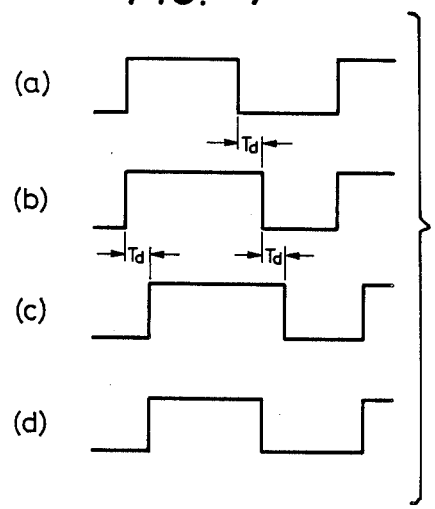
FIG. 7 is a diagram for explaining the operation of the conventional pulse width distortion correction circuit.

Further, although the adder 4 and the inverter are used in the pulse width control circuit 7 in the above-mentioned embodiment, as shown in FIG. 4, a comparator 17 having plus and minus input terminals connected to the output of the integrator 2 and the pulse width control terminal 3 respectively may be used in place of the adder 4 and the inverter 5. In this case, the inverters 9 and 10 are omitted, as shown in FIG. 5, and a comparator 18 with the same characteristic as the comparator 17 may be used in place of the inverter 11.

Although the embodiment has been described as applied to a rectangular signal, the same effect as the above-mentioned embodiment can be obtained even in the case of a digital signal excluding a direct component, such as a bi-phase signal or the like.

As described above, according to the present invention, a pulse width control circuit and a duty ratio detection circuit are used, and the pulse width control circuit is controlled so that an output signal has high and low level time widths which are made equal to each other. Accordingly, it is possible to automatically correct pulse width distortion even if the pulse width distortion is changed by the change of the condition of a transmission line and so on. Moreover, it is possible to suppress jitter or a frequency component lower than the frequency determined by the time constant of the low pass filters 12 and 13.

What is claimed is:

1. A pulse width distortion correction circuit comprising:
   a pulse width control circuit to which a digital input signal is applied and providing an output signal having a corrected pulse width; and
   a duty ratio detection circuit for detecting a duty ratio of said output signal of said pulse width control circuit and providing a pulse width control signal, said pulse width control circuit being controlled on the basis of said pulse width control signal;
   said pulse width control circuit comprising edge smoothing means to which said digital input signal is applied, an adder for adding an output signal of said edge smoothing means to said pulse width control signal, and a logical element to which an output signal of said adder is applied and providing said output signal of said pulse width control circuit.

2. A pulse width distortion correction circuit according to claim 1, wherein said edge smoothing means comprises an integrator.

3. A pulse width distortion correction circuit according to claim 1, wherein said logical element is responsive to continuously varying values of said output signal of said adder and provides said output signal of said pulse width control circuit as a digital output.

4. A pulse width distortion correction circuit according to claim 1, in which said pulse width control circuit comprises edge smoothing means to which said digital input signal is applied and a voltage comparator for comparing an output signal of said edge smoothing means with said pulse width control signal.

5. A pulse width distortion correction circuit comprising:
- a pulse width control circuit to which a digital input signal is applied and providing an output signal having a corrected pulse width; and
- a duty ratio detection circuit for detecting a duty ratio of said output signal of said pulse width control circuit and providing a pulse width control signal, said pulse width control circuit being controlled on the basis of said pulse width control signal, said duty ratio detection circuit comprising a first low pass filter to which is applied a signal having a polarity the same as a detection input signal derived from said output signal of said pulse width control circuit, a second low pass filter to which is applied a signal having a polarity opposite to that of said detection input signal, and a differential amplifier for amplifying a difference between an output of said first low pass filter and an output of said second low pass filter to form said pulse width control signal.

6. A pulse width distortion correction circuit comprising:
- a pulse width control circuit to which a digital input signal is applied and providing an output signal having a corrected pulse width; and
- a duty ratio detection circuit for detecting a duty ratio of said output signal of said pulse width control circuit and providing a pulse width control signal, said pulse width control circuit being controlled on the basis of said pulse width control signal;
- wherein said pulse width control circuit comprises edge smoothing means to which said digital input signal is applied and a voltage comparator for comparing an output signal of said edge smoothing means with said pulse width control signal.

7. A pulse width distortion correction circuit according to claim 6, wherein said edge smoothing means comprises an integrator.

8. A pulse width distortion correction circuit according to claim 6, wherein said pulse width control signal controls said pulse width control circuit to provide said output signal thereof having a predetermined value of said duty ratio.

* * * * *